United States Patent [19]
Tihanyi

[11] Patent Number: 4,630,084
[45] Date of Patent: Dec. 16, 1986

[54] VERTICAL MIS-FIELD EFFECT TRANSISTOR WITH LOW FORWARD RESISTANCE

[75] Inventor: Jenö Tihanyi, Munich, Fed. Rep. of Germany

[73] Assignee: Siemens Aktiengesellschaft, Berlin and Munich, Fed. Rep. of Germany

[21] Appl. No.: 724,792

[22] Filed: Apr. 19, 1985

Related U.S. Application Data

[63] Continuation of Ser. No. 340,749, Jan. 19, 1982, abandoned.

[30] Foreign Application Priority Data

Feb. 2, 1981 [DE] Fed. Rep. of Germany ....... 3103444

[51] Int. Cl.$^4$ ............................................. H01L 29/78
[52] U.S. Cl. ................... 357/23.4; 357/23.13; 357/38; 357/43
[58] Field of Search ............ 357/23.4, 23.13, 43, 357/38, 20

[56] References Cited

U.S. PATENT DOCUMENTS

| | | | |
|---|---|---|---|
| 3,439,237 | 4/1969 | Sylvan | 357/21 |
| 3,911,463 | 10/1975 | Hull et at. | 357/21 |
| 4,148,047 | 4/1979 | Hendrickson | 357/23 VD |
| 4,300,150 | 11/1981 | Colak | 357/23 VD |
| 4,376,286 | 3/1983 | Lidow et al. | 357/23 VD |
| 4,402,003 | 8/1983 | Blanchard | 357/23 VD |

FOREIGN PATENT DOCUMENTS

| | | | |
|---|---|---|---|
| 2215167 | 10/1972 | Fed. Rep. of Germany | 357/38 T |
| 54-112179 | 9/1979 | Japan | 357/23.4 |
| 54-116887 | 9/1979 | Japan | 357/23,13 |
| 54-144182 | 11/1979 | Japan | 357/23.4 |

OTHER PUBLICATIONS

A. Ambroziak, "Dev. W. a New Type of Current-Volt. Char.," IEEE, J. S-S Ckts., vol. SC-6 #2, Apr. 1971, p. 87.

J. Tihany, "Funct. Integ. of PWR, MOS and Bipolar Dev.," IEEE, Int. Elect. Dev. Meet., Wash., D.C., 12-8-1980, Proc., pp. 75-78.

*Primary Examiner*—Joseph E. Clawson, Jr.
*Attorney, Agent, or Firm*—Herbert L. Lerner; Laurence A. Greenberg

[57] ABSTRACT

MIS-FET, including a semiconductor substrate of a given first conductivity type having first and second surfaces, at least one channel zone of a second conductivity type opposite the first conductivity type embedded on the first surface of the substrate, a source zone of the first conductivity type embedded in the channel zone, a drain zone adjoining the first surface of the substrate, a drain electrode connected to the second surface of the substrate, and insulating layer disposed on the first surface of the substrate, at least one gate electrode disposed on the insulating layer, at least one injector zone of the second conductivity type embedded in the first surface of the substrate, and a contact being connected to the at least one injector zone and connectible to a voltage supply.

6 Claims, 4 Drawing Figures

VERTICAL MIS-FIELD EFFECT TRANSISTOR WITH LOW FORWARD RESISTANCE

This application is a continuation of application Ser. No. 340,749, filed Jan. 19, 1982, now abandoned.

The invention relates to an MIS-field effect transistor (FET) with a semiconductor substrate of a first conduction or conductivity type, at least one channel zone of the opposite conduction type embedded in the surface of the substrate, a source zone of the first conduction type embedded in the channel zone, a drain zone adjoining this surface, a drain electrode connected to the other surface, and at least one gate electrode which is applied over an insulating layer applied on the one surface.

Such an MIS-FET has already been described, for instance, in German Published, Non-Prosecuted Application DE-OS No. 27 03 877. One embodiment in that publication is constructed as a vertical MIS-FET, in which the source electrode and the drain electrode are disposed on different sides of the semiconductor substrate. In such FET's, the higher the forward resistance in the switched-on state, the higher the maximum blocking voltage for which the FET is constructed. The term "blocking voltage" is understood in this context to be that reverse voltage which the FET can cut off in the forward direction. The forward resistance $R_{on}$ increases approximately proportionally to $U_{Block}^{2.5}$. It follows that the forward resistance $R_{on}$ for maximum blocking voltages above about 300 V is higher than in the case of bipolar transistors constructed for the same blocking voltage.

It is accordingly an object of the invention to provide a vertical MIS-field effect transistor with low forward resistance, which overcomes the hereinafore-mentioned disadvantages of the heretofore-known devices of this general type, and to do so in such a way that the forward resistance can be lowered considerably.

With the foregoing and other objects in view there is provided, in accordance with the invention, an MIS-FET, comprising a semiconductor substrate of a given first conductivity type having first and second surfaces, at least one channel zone of a second conductivity type opposite the first conductivity type embedded in the first surface of the substrate, a source zone of the first conductivity type embedded in the channel zone, a drain zone adjoining the first surface of the substrate, a drain electrode connected to the second surface of the substrate, an insulating layer disposed on the first surface of the substrate, at least one gate electrode disposed on the insulating layer, at least one injector zone of the second conductivity type embedded in the first surface of the substrate, and a contact being connected to the at least one injector zone and connectible to a voltage supply.

In accordance with another feature of the invention, the injector zone and the channel zone have the same depth and doping concentration.

In accordance with a further feature of the invention, the at least one injector zone and channel zone are in the form of a plurality of injector zones and channel zones in the substrate being at least substantially uniformly distributed over the first surface of the substrate, and the contact connected to the at least one injector zone is in the form of a plurality of contacts each being connected to one of the injector zones and being electrically connected to each other.

In accordance with an added feature of the invention, the at least one injector zone and channel zone are in the form of strip-shaped injector zones and strip-shaped channel zones being alternatingly disposed relative to each other in the substrate, and the contact connected to the at least one injector zone is in the form of a plurality of contacts each being connected to one of the injector zones and being electrically connected to each other.

In accordance with an additional feature of the invention, the at least one injector zone and channel zone are each comb-shaped and interleaved with each other.

In accordance with again another feature of the invention, the electrode connected to the at least one injector zone is electrically connected to the at least one gate electrode.

In accordance with a concomitant feature of the invention, there is provided a resistor connected between the electrode connected to the at least one injector zone and the at least one gate electrode.

Other features which are considered as characteristic for the invention are set forth in the appended claims.

Although the invention is illustrated and described herein as embodied in a vertical MIS-field effect transistor with low forward resistance, it is nevertheless not intended to be limited to the details shown, since various modifications and structural changes may be made therein without departing from the spirit of the invention and within the scope and range of equivalents of the claims.

The construction and method of operating of the invention, however, together with additional objects and advantages thereof will be best understood from the following description of specific embodiments when read in connection with the accompanying drawings, in which:

Figure 1:
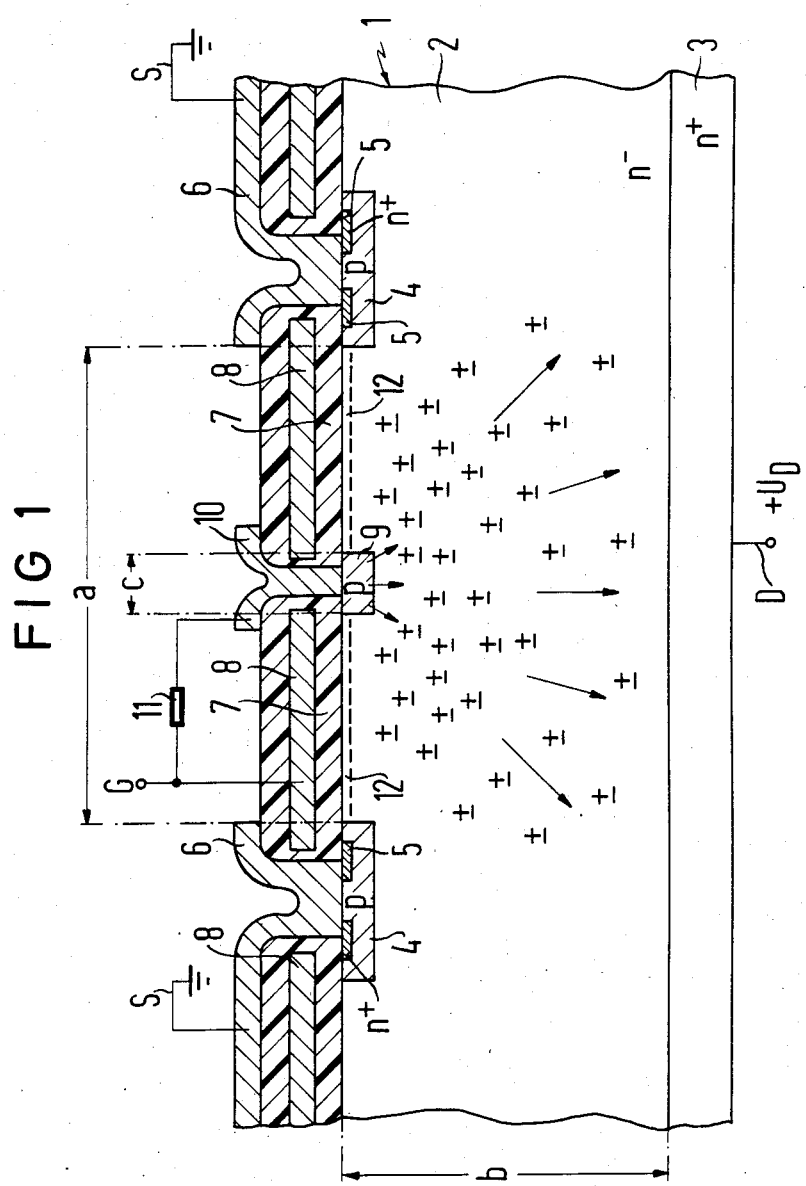
FIG. 1 is a fragmentary, diagrammatic, cross-sectional view through a vertical MIS-FET according to the invention.

Referring now to the figures of the drawing and first particularly to FIG. 1 thereof, it is seen that the vertical MIS-FET is designated with reference symbol 1. It has, for instance, a weakly n-doped substrate 2 which is adjoined by a heavily n-doped zone 3. Channel zones 4 of the opposite conductivity or conduction type are embedded in one surface of the substrate 2. The channel zones 4 are disposed at a distance "a" from each other and are p-doped in this case. Source zones 5 of the first conduction type are embedded in the channel zones 4. There, the source zones 5 are heavily n-doped and can be made either by diffusion or by ion implantation. In the substrate, an injector zone 9 having the conduction type opposite the substrate and a width "c", is disposed between the channel zones 4. In this case, the injector zone 9 is p-doped and may have the same depth and doping concentration as the channel zone 4. The surface of the substrate 2, on which the channel zones 4 and the source zones 5 are located, is covered with an insulating layer 7, which may be silicon dioxide. The layer 7 merely leaves openings through which the channel zones 4, the source zones 5 and the injector zone ("further zone") 9 are contacted by source contact 6 and further zone contact 10, respectively. The further zone contact 6 is connected by a line S to ground. On the insulating layer 7 there is located a gate electrode 8 which covers a part of the injector zone 9, a part of the channel zones 4 between the source zones 5 and the part of the substrate 2 which emerges to the surface. This part of the substrate 2 and the part underneath serve as a drain zone. A drain electrode D carrying a voltage $+U_D$ is applied to the other surface of the semiconductor body. The gate electrode 8 is provided with a gate terminal G. The electrode or contact 10 of the injector zone 9 can be connected to a voltage supply which causes injection of positive charge carriers into the substrate 2. Preferably, the electrode 10 can be connected to the gate terminal G through a resistor 11.

If a positive gate voltage is applied to the gate electrode G, an n-conduction channel is developed, through which electrons flow from the source zones to the drain zone, on the surface of the channel zone 4 between the source zones 5 and the substrate 2 due to the field effect. Due to the positive charging of the gate electrode 8, a strongly n-conducting accumulation layer 12 is developed at the surface of the substrate (i.e. in the drain zone). This layer 12 is of approximately ohmic character and therefore has a negative potential relative to the injector zone 9. The injector zone 9 therefore injects positive charge carriers into the drain zone, which move in a certain region around the injector zone to the drain electrode D. In accordance with the increased density of positive charge carriers, an enrichment of negative charge carriers also takes place around and under the injector zone 9, which is equivalent to increasing the doping concentration in the current-carrying region. This means that the forward resistance in the switched-on state is substantially reduced in the current-carrying region which is located substantially under the accumulation layer 12 and the injector zone 9.

In order to allow a high charge carrier density while the injector current is simultaneously small, the width of the injector zone "c" should be small as compared to the thickness "b" of the substrate. For a width of $c=5$ to 10 $\mu$m, a thickness $b=50$ $\mu$m and $a=50$ $\mu$m, a reduction of the switched-on resistance $R_{on}$ by a factor of 3 was obtained with an injector current of approximately 1 mA and a width W of about 100 $\mu$m (see FIGS. 3 and 4).

Figure 2:
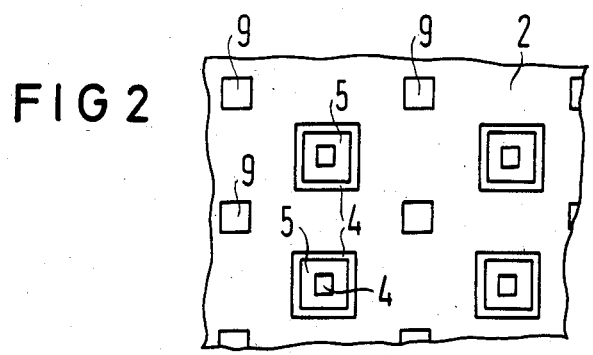
FIGS. 2, 3 and 4 are fragmentary top plan views onto three embodiment examples having different forms of the source zones and injector zones.
Figure 3:
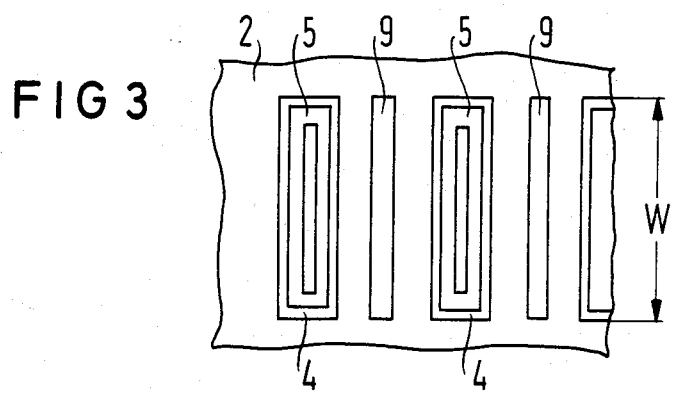
Figure 4:
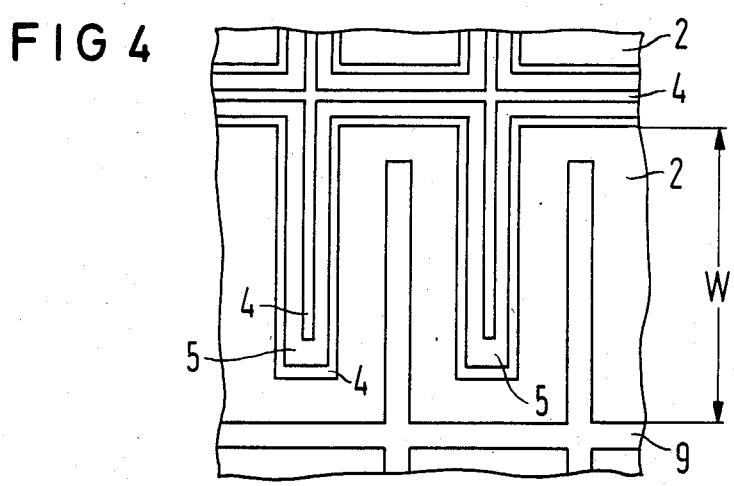

The physical relationship which can be provided between the injector zones 9 and the channel zones 4 and the source zones 5 is shown in FIGS. 2–4. For better clarity of presentation, all contacts, the gate electrode and the insulating layer have been removed in the figures mentioned. In FIG. 2, an island-shaped distribution of the injector zones 9 is shown, in which the zones mentioned have the shape of a square. In FIG. 3, the zones are strip-shaped and alternate with each other. In FIG. 4, the zones mentioned above are made in the form of a comb and are interleaved with each other. In these figures, the sections shown are always from the substrate; depending on the desired current, it is necessary to multiply the arrangements shown in the substrate. The contacts are advantageously connected to each other by metallic conductor runs. The resistor 11 shown in FIG. 1 can also be integrated into the substrate. Other shapes are also possible but it is essential that the injector zone is located in the current-carrying region.

With the MIS-FET's shown, a certain amount of addressing power is necessary. The essential advantage of an MIS-FET, i.e. the short switching time, is, however, preserved. This is because contrary to a bipolar transistor, the charge carriers contained in the semiconductor body are cleaned out in this case by the source-drain voltage, i.e. by an electric field and not by recombination.

There are claimed:

1. MIS-FET, comprising a semiconductor substrate of a given first conductivity type having first and second surfaces, at least one channel zone of a second conductivity type opposite said first conductivity type embedded in said first surface of said substrate, a source zone of said first conductivity type embedded in said channel zone a source contact connected to the source zone, a drain zone having a surface and adjoining said first surface of said substrate, a drain electrode connected to said second surface of said substrate, an insulating layer disposed on said first surface of said substrate, at least one gate electrode disposed on part of said insulating layer, at least one further zone of said second conductivity type embedded in the surface of said drain zone and a further zone contact being connected to said at least one further zone, and said gate electrode covering part of said further zone and said part of said drain zone emerging to said first surface of said substrate, means for applying a first voltage of opposite polarity of the majority carriers of the drain zone to the drain electrode, a reference voltage of opposite polarity of said first voltage to the source contact and a gate voltage of the same polarity as the first voltage to the gate electrode, and wherein said further zone contact is electrically connected to said at least one gate electrode for injecting charge carriers of the same polarity as the first voltage into said drain zone.

2. MIS-FET according to claim 1, wherein said further zone and said channel zone have the same depth and doping concentration.

3. MIS-FET according to claim 1 or 2, wherein said at least one further zone and channel zone are in the form of a plurality of further zones and channel zones in said substrate being at least substantially uniformly distributed over said first surface of said substrate, and said contact connected to said at least one further zone is in the form of a plurality of contacts each being connected to one of said further zones and being electrically connected to each other.

4. MIS-FET according to claim 1 or 2, wherein said at least one further zone and channel zone are in the form of strip-shaped further zones and strip-shaped channel zones being alternatingly disposed relative to each other in said substrate, and said contact connected to said at least one further zone is the the form of a plurality of contacts each being connected to one of said further zones and being electrically connected to each other.

5. MIS-FET according to claim 1 or 2, wherein said at least one further zone and channel zone are each comb-shaped and inter-leaved with each other.

6. MIS-FET, comprising a semiconductor substrate of a given first conductivity type having first and second surfaces, at least one channel zone of a second conductivity type opposite said first conductivity type embedded in said first surface of said substrate, a source zone of said first conductivity type embedded in said channel zone, a source contact connected to the source zone, a drain zone having a surface and adjoining said first surface in said substrate, a drain electrode connected to said second surface of said substrate, an insulating layer disposed on said first surface of said substrate, at least one gate electrode disposed on part of said insulating layer, at least one further zone of said second conductivity type embedded in the surface of said drain zone, and a further zone contact being connected to said at least one further zone, and said gate electrode covering part of said further zone and said part of said drain zone emerging to said first surface of said substrate and means for applying a first voltage of opposite polarity of the majority carriers of the drain zone to the drain electrode, a reference voltage of opposite polarity of said first voltage to the source contact and a gate voltage of the same polarity as the first voltage to the gate electrode, including a resistor connected between said further zone contact and said at least one gate electrode for injecting charge carriers of the same polarity as the first voltage into said drain zone.

* * * * *